(12) United States Patent
Sutter et al.

(10) Patent No.: US 8,278,124 B2
(45) Date of Patent: Oct. 2, 2012

(54) ASSEMBLY OF ORDERED CARBON SHELLS ON SEMICONDUCTING NANOMATERIALS

(75) Inventors: Eli Anguelova Sutter, Westhampton Beach, NY (US); Peter Werner Sutter, Westhampton Beach, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 12/658,810

(22) Filed: Feb. 16, 2010

(65) Prior Publication Data

US 2010/0159618 A1    Jun. 24, 2010

Related U.S. Application Data

(62) Division of application No. 11/854,168, filed on Sep. 12, 2007, now Pat. No. 7,714,317.

(60) Provisional application No. 60/968,991, filed on Aug. 30, 2007.

(51) Int. Cl.
*H01L 21/66* (2006.01)
*H01L 21/268* (2006.01)
*H01L 21/30* (2006.01)

(52) U.S. Cl. ............ 438/15; 438/14; 438/798; 438/765; 438/106; 257/E21.529; 257/E21.347; 257/E21.211

(58) Field of Classification Search ....... 257/9, E21.529, 257/E21.347, E21.211; 438/14, 798, 765, 438/15, 106

See application file for complete search history.

(56) References Cited

U.S. PATENT DOCUMENTS

| 5,916,642 | A | 6/1999 | Chang |
| 7,714,317 | B2 | 5/2010 | Sutter et al. |
| 7,754,183 | B2 * | 7/2010 | Keskar et al. ............. 423/447.3 |
| 7,939,218 | B2 * | 5/2011 | Niu ............... 429/532 |
| 2002/0172820 | A1 | 11/2002 | Majumdar et al. |
| 2005/0221083 | A1 * | 10/2005 | Belcher et al. ............... 428/364 |
| 2006/0188774 | A1 | 8/2006 | Niu et al. |
| 2008/0081388 | A1 * | 4/2008 | Yasseri et al. .................. 438/22 |
| 2008/0230763 | A1 * | 9/2008 | Zaidi et al. ....................... 257/9 |
| 2008/0237568 | A1 * | 10/2008 | Kobayashi et al. ............. 257/9 |
| 2009/0257921 | A1 | 10/2009 | Sutter et al. |

OTHER PUBLICATIONS

T. I. Kamins, X. Li and R. Stanley Williams, "Growth and Structure of Chemically Vapor Deposited Ge Nanowires on Substrates," Nano Letters, vol. 4, No. 3, pp. 503-506 (2004).*
Sutter, Eli, et al., "One-step Synthesis of Ge—$SiO_2$ Core-Shell Nanowires," *Applied Physics Letters*, 94, pp. 083109-1-083109-3 (2009).
Zhou, H., et al., "Water-dispersible, Multifunctional, Magnetic, Luminescent Silica-Encapsulated Composite Nanotubes," *Small*, 6 (3), pp. 412-420 (2010).

* cited by examiner

*Primary Examiner* — Tom Thomas
*Assistant Examiner* — Benjamin Tzu-Hung Liu
(74) *Attorney, Agent, or Firm* — Dorene M. Price

(57) ABSTRACT

In some embodiments of the invention, encapsulated semiconducting nanomaterials are described. In certain embodiments the nanostructures described are semiconducting nanomaterials encapsulated with ordered carbon shells. In some aspects a method for producing encapsulated semiconducting nanomaterials is disclosed. In some embodiments applications of encapsulated semiconducting nanomaterials are described.

14 Claims, 7 Drawing Sheets

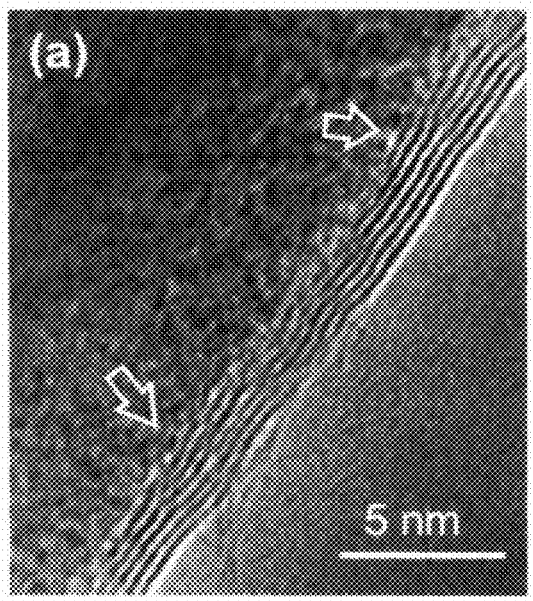 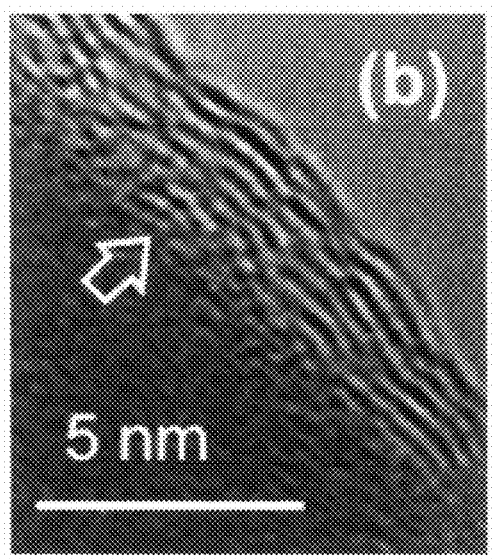
Fig. 7(a)  Fig. 7(b)
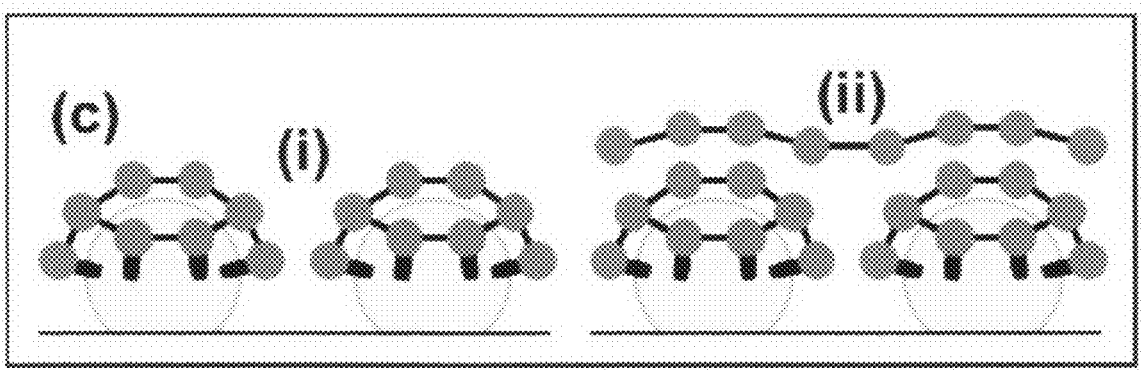
Fig. 7(c)

ASSEMBLY OF ORDERED CARBON SHELLS ON SEMICONDUCTING NANOMATERIALS

CROSS-REFERENCE TO RELATED APPLICATIONS

This application is a divisional of U.S. patent application Ser. No. 11/854,168 filed Sep. 12, 2007, itself a non-provisional application claiming the benefit of U.S. Provisional Patent Application Ser. No. 60/968,991 filed Aug. 30, 2007, each of which applications is hereby incorporated by reference in its entirety.

STATEMENT REGARDING FEDERALLY SPONSORED RESEARCH

This invention was made with Government support under contract number DE-AC02-98CH 10886, awarded by the U.S. Department of Energy. The Government has certain rights in the invention.

BACKGROUND

The invention relates to the field of encapsulating nanomaterials and, in particular, to the encapsulation of semiconducting nanowires and carbon-encapsulated semiconducting nanowires.

SUMMARY

Recognizing the challenges of obtaining passivated nanoscale semiconductors, the technology described herein offers a way of passivating nanoscale objects and discloses structures that result from employing the technology.

Thus, in some embodiments methods for passivating semiconducting nanomaterials are presented. In some embodiments passivation of elemental semiconductors is described; in some embodiments passivation of compound semiconductors is described. In some embodiments semiconducting superlattices are passivated by ordered shells of graphitic carbon. In some embodiments the passivated semiconducting nanomaterials retain their inherent optical, magnetic, and electrical properties.

In some embodiments passivated semiconducting nanomaterials are described. In some embodiments the passivated nanomaterials may be used in magnetic, electronic, optical, and electro-optical devices. In some embodiments the nanomaterials may be employed as sensors, light sources, light absorbers, and the like.

It should be understood that the foregoing, being a summary, is necessarily a brief description of some aspects of the invention, which may be better understood with reference to the drawings and the following detailed description.

BRIEF DESCRIPTION OF THE DRAWINGS

FIGS. 7A and 7B are TEM images and FIG. 7C a schematic representation of the core/shell interface of an In-decorated GaN NW embedded in a C shell.

DETAILED DESCRIPTION

Figure 1A:
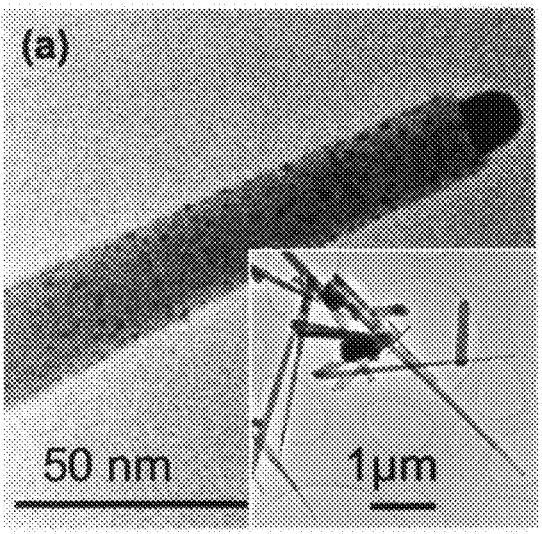
FIGS. 1A, 1B, and 1C depict transmission electron microscope (TEM) images of as-grown Ge nanowires (NWs) taken at room temperature prior to annealing.

In the field of nanotechnology vocabulary is often ill-defined. However, as used herein, "nanoscale" refers to dimensions between about 0.1 nm and 500 nm. In this realm, objects may be referred to by their "dimensionality" from the number of degrees of freedom available to the charge carriers in the object. Quantum dots, for example, are zero-dimensional clusters of atoms or molecules a few ($\leq 10$) nanometers in diameter. This is to be differentiated from the term "dimension" which refers to the size of the object. Usually the smallest dimension of an object is referred to as its "diameter," even if the cross-section of the object in the plane of the diameter is not circular. Thus quantum dots, nanorods, nanowires, nanotubes, nanospheres, nanoparticles, and so on all have diameters, the dimension of which is on the order of nanometers. In the abstract, and for purposes of discussion rather than limitation, these objects may all be termed "nanomaterials."

Semiconductors are materials that may be insulating or conducting, depending on the temperature and the presence of impurities in the material. Silicon, on which virtually all modern electronic technology is based, is an elemental semiconductor. Elemental semiconductors consist of pure elements, like silicon (Si) and germanium (Ge). Si and Ge are both in Group IV of the periodic table of the elements, and are often referred to, with other elements of the same group, as group IV semiconductors. To obtain different properties, such as band gap or carrier mobility, members of Group IV may be substituted for each other, as in $Si_{1-x}Ge_x$, where x is less than or equal to one. Other semiconductors may be compounds. Gallium nitride (GaN), a material from which blue light-emitting diodes (LEDs) can be made, is a III-V semiconductor, so called because Ga is an element in Group III and N is a Group V element. Compounds of elements from Groups II and VI may also be semiconducting. An example of a II-VI semiconductor is cadmium selenide (CdSe), a preferred compound for quantum dots. Just as Si and Ge can substitute for one another, elements of Group III, e.g. Ga and Al, can be substituted in large or small amounts. In addition to other members of Group II, many transition metals may be substituted for Cd in II-VI compounds. In fact, any element that has the same, or equal, valence, i.e. is equivalent, may be substituted, e.g. $Cd_{1-x}Mn_xTe$ or $Cd_{1-x}Zn_xTe$. Group V and VI substitutions work similarly, e.g. $InAs_{1-x}P_x$ and $CdSe_{1-x}Te_x$. Some transition metal oxides, such as titania ($TiO_2$) and zinc oxide (ZnO), both used in sunscreens, are also semiconductors.

Semiconductors have very interesting properties. For example, the resistance of a semiconductor can be changed over orders of magnitude by adding parts per million of dopants (desirable and controllable impurities). Semiconductors have gaps in their electronic energy bands which result in threshold voltages below which current cannot flow, making them suitable as diodes and transistors. These gaps also restrict absorption and emission of light by a semiconductor to discrete wavelengths. In addition, when light is absorbed charge carriers are created, changing the electrical properties of the semiconductor. Solar cells make use of this property to convert light energy into electrical energy.

Not all impurities are desirable or controllable, however. Impurities and imperfections can add electronic energy levels within the bandgap, which may have unpredictable effects on the semiconductor's properties. Surfaces of semiconductors are common sources of energy states such as these, producing surface electronic states, or surface states, in the band gap. Surface states, caused by the surface itself or by impurities adsorbed on the surface, change the properties of semiconductors in uncontrollable and unpredictable ways. To avoid surface states, semiconductors may be passivated by materials that leave their original electrical and optical properties intact. Si has a native oxide, $SiO_2$, that serves to passivate the Si surface. This is one of the materials properties of Si that makes it so suitable for use in electronic devices. Not all semiconductors have surface oxides, however, and even those that do may not be passivated by them. Other materials, then, must be found that can satisfy the unsatisfied and/or strained bonds that cause surface states.

Bulk semiconductors, the form used in electronics and LEDs, depend on their intrinsic band gaps and impurity states for their electrical and optical properties. Nanoscale semiconductors, however, have quite different properties than their bulk cousins. Due to their small size, their charge carriers, electrons and holes, are confined to energy levels that are allowed by quantum mechanics. For example, quantum dots absorb or emit light at different wavelengths depending on, and therefore tunable by, their dimensions. These properties, however, may be modified by surface states induced by unsatisfied bonds, oxides of one or more elements of the semiconductor, or adsorbed impurities on the surface of the nanoobjects, and the like. The much higher surface area per unit volume (surface-to-volume ratio) of these materials magnifies the difficulties posed by surface states.

Recognizing the challenges of obtaining passivated nanoscale semiconductors, the technology described herein offers a way of passivating nanoscale objects and discloses structures that result from employing the technology.

Semiconducting nanomaterials may be fabricated in any of several ways, and no few of them may be bought from commercial suppliers. Some of the formation methods employ metal catalysts to direct the size and shape of the resulting nanomaterial. Other methods do not require catalysts. The choice of method for forming semiconducting nanomaterials depends on the composition of the material and on the desired shape of the resultant semiconducting nanomaterial, i.e. quantum dot, nanowire, nanotube, etc. Some of the methods employed to form semiconducting nanomaterials include laser ablation, chemical vapor deposition (CVD), molecular beam epitaxy (MBE), chemical vapor transport reactions, and low-temperature solution-phase synthesis. Other methods are also well known in the art. For example, high-aspect-ratio nanowires of Ge may fabricated by CVD using Au/Ge catalyst particles.

Figure 1B:
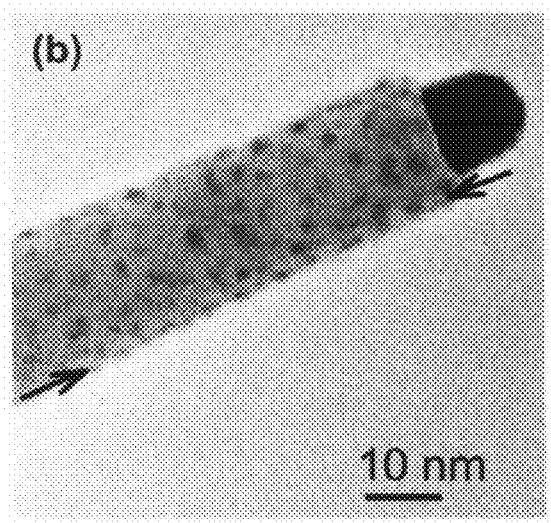
Figure 1C:
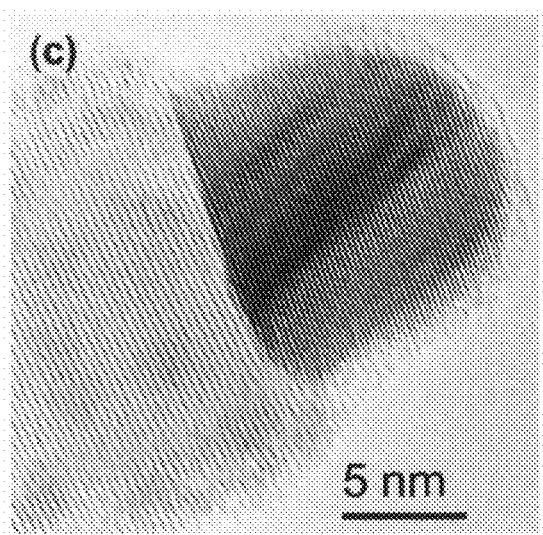

When Ge nanowires (NW) are transported through air, an oxide shell, typically 1-4 nm thick, forms on the surface. Unlike the case of the $Si/SiO_2$ system, the $GeO_x$ oxide layer does not passivate the Ge nanomaterial surface. FIGS. 1A through 1C are TEM images, taken at room temperature, showing the detailed structure of as-grown Ge NWs close to the NW tip for one of the wires from the inset. The Au/Ge catalyst nanoparticles show darker contrast than do the Ge NWs themselves. In the high-resolution TEM images of FIGS. 1B and 1C, the (111) lattice planes of the Au/Ge alloy with separation of 0.219 nm, close to the lattice spacing of Au, are clearly resolved. The NW axis is aligned with the [111] direction. The high-resolution images show lattice fringes with separation of 0.327 nm perpendicular to the NW axis, consistent with the spacing of (111) planes in bulk Ge. Au from the catalyst particles segregates to the surface of the nanowires where it typically forms metal islands rather than smooth monolayers of metal. This is shown in FIG. 1B by the spots of darker contrast, pointed out by the arrows. During in situ annealing the Au aggregates have been observed to ripen rapidly into larger, elongated crystalline clusters aligned with the NW axis.

FIGS. 2A through 2I show a sequence of TEM images illustrating the process of the removal of a germanium oxide surface layer and the assembly of a carbon shell around a Ge NW during in situ annealing. The TEM samples were placed on amorphous carbon supports, which also served as a source of C, and loaded into the microscope under vacuum conditions, i.e. at pressures below about 1 torr, down to about 1 or $2 \times 10^{-5}$ torr or less. In an inert gas atmosphere any pressure, including atmospheric pressure, is applicable. Other sources of C may include other carbon-containing support materials or carbon-carrying precursor gases such as hydrocarbon gases including ethylene and acetylene. During in situ annealing the sample is also exposed to an electron beam. In general, during the process of forming the ordered carbon encapsulant the sample may be subject to irradiation by an electron beam with electron energy between 100 eV and 1 MeV.

Figure 2A:
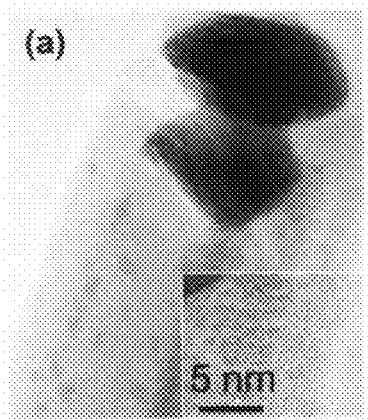
FIGS. 2A through 2I show a sequence of TEM images illustrating the process of removal of a germanium oxide surface layer and the assembly of a carbon shell around a Ge NW during in situ annealing.
Figure 2B:
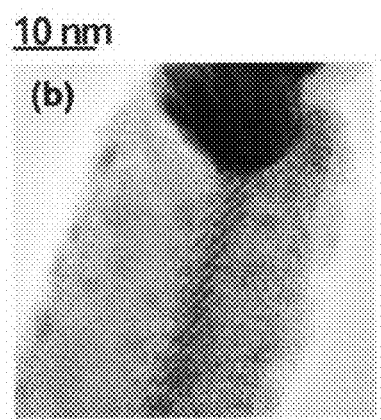
Figure 2C:
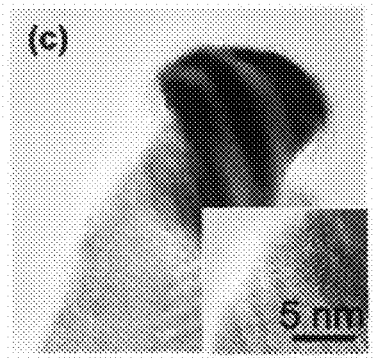
Figure 2D:
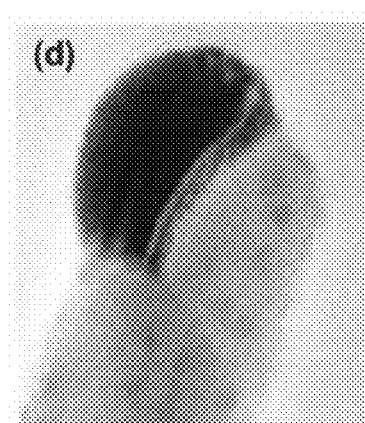

The Ge NW shown in FIG. 2A exhibits a thick (~4 nm) layer of oxide. As seen in the inset, which shows the interface between the Ge wire and the $GeO_x$ surface layer, the oxide is amorphous and its interface with the Ge surface is atomically sharp. Upon heating the wires to 180° C. the thickness of the oxide layer can be observed to decrease over a course of minutes, sometimes about 5 minutes, under electron beam irradiation creating large areas of the NW surface that are entirely oxide free. FIG. 2B shows a stage of the process at which the oxide thickness has decreased to about 2.5 nm, while FIG. 2C shows the oxide entirely removed over large parts of the NW surface (FIG. 2C inset). The remaining oxide patches are completely removed after the temperature is increased to about 290° C., as seen in FIG. 2D. The removal of the oxide may be caused by thermal or electron-beam-induced desorption or by the oxide's reduction by carbon.

Figure 2E:
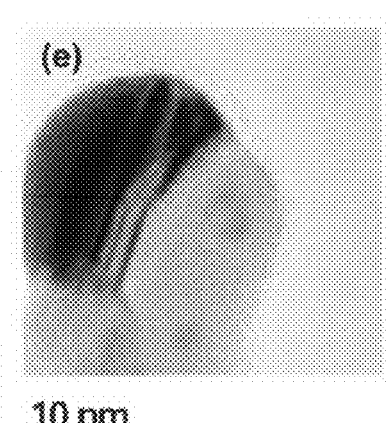
Figure 2F:
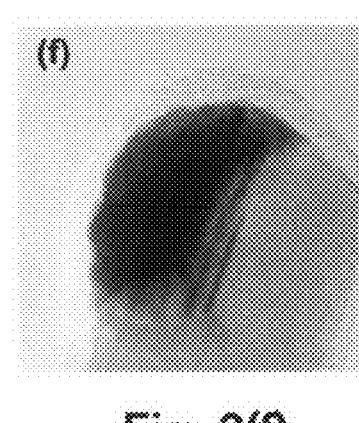
Figure 2G:
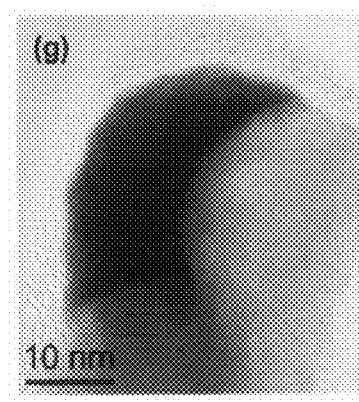
Figure 2H:
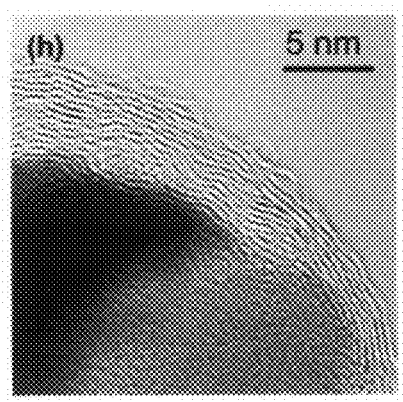
Figure 2I:
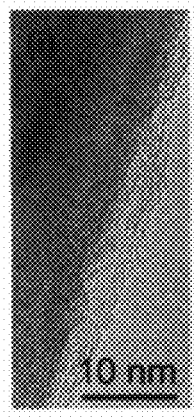

After removal of the surface oxide from Au-decorated Ge NWs, also at a temperature of about 290° C., however, assembly of graphene C fragments is initiated at the tip of the NW adjacent to the Au/Ge nanoparticle. FIGS. 2E, 2F, and 2G show the continued build-up and organization of the C shell occurring both on the catalyst particle and on the surface of the Ge. FIG. 2E shows shell formation starting with the assembly of small curved segments at a temperature of about 340° C. These segments gradually build up several layers covering the whole NW (FIG. 2F, T=340° C.) and eventually straighten and organize into stacks of extended curved graphene sheets (FIGS. 2G and 2H, T=355° C.). From the high-resolution image of FIG. 2H the spacing of the graphene layers is determined to be about 0.3-0.4 nm, consistent with the c-axis spacing of graphite. From FIG. 2I, taken far from the NW tip and the Au/Ge catalyst particle, the entire Ge wire appears embedded in a C shell of several graphene layers. Under a variety of experimental conditions, metal-free Ge nanoparticles, i.e. pristine Ge nanoparticles, have not been observed to develop passivated surfaces. In particular, they do not form protective shells of ordered C. In general the chemistry of the surfaces of semiconductors prohibits the formation of passivating ordered shells of graphitic carbon.

Figure 3A:
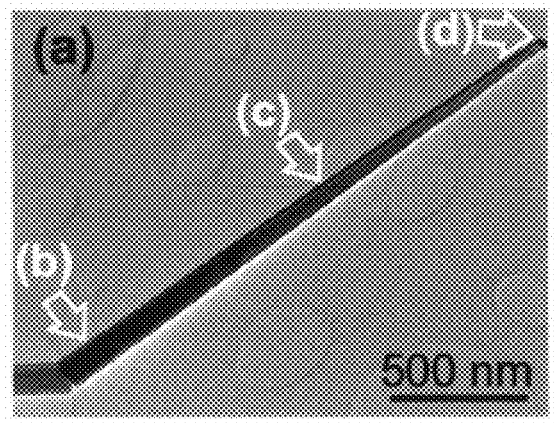
FIGS. 3A through 3D show TEM images of a Ge NW completely embedded in a multilayer C shell.
Figure 3B:
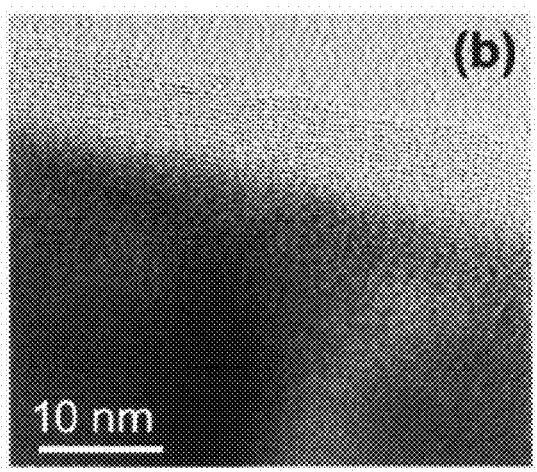
Figure 3C:
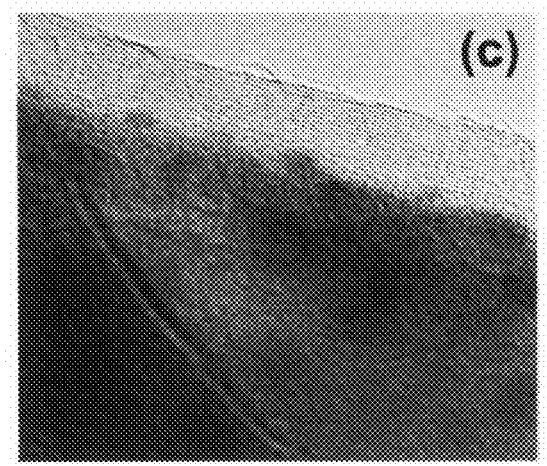
Figure 3D:
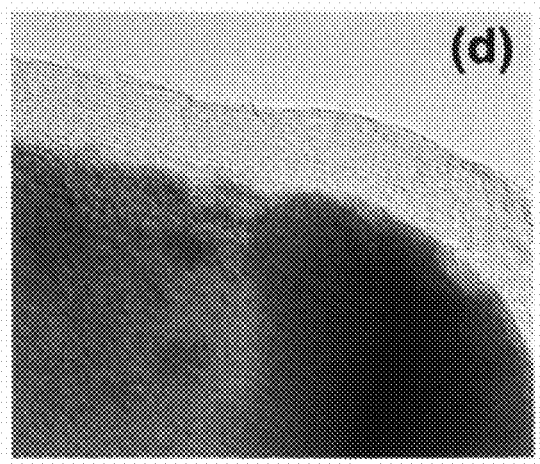

FIGS. 3A through 3D show TEM images of a Ge NW completely embedded in a multilayer C shell. An overview of the embedded nanowire is shown in FIG. 3A. This wire gradually widens from the tip (nearest the catalyst particle) to the far end (farthest from the catalyst). The higher resolution micrographs of FIGS. 3B through 3D were taken at the respective areas pointed out with the arrows in FIG. 3A. They show that, although the thickness of the C shell decreases somewhat from the tip to the far end of the wire, the shell is relatively uniform throughout the length of the wire.

Figure 4A:
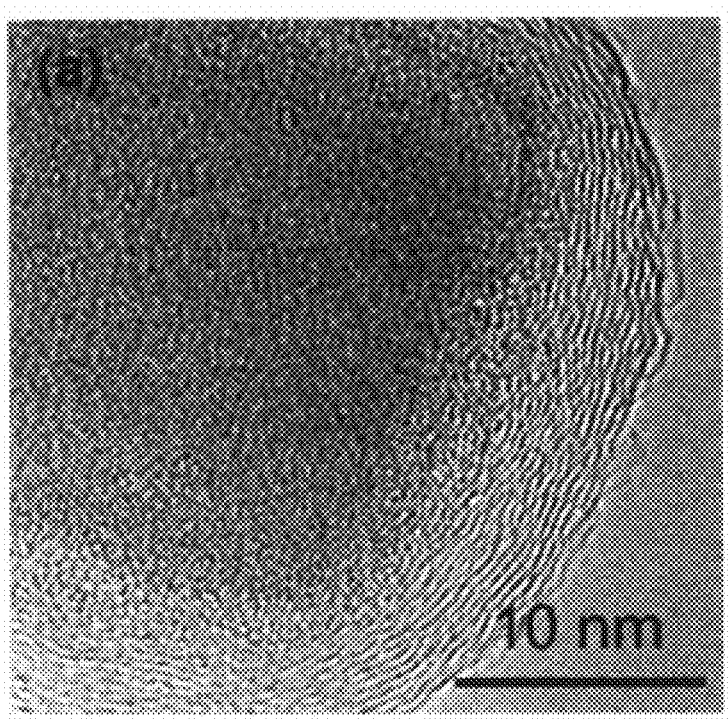
FIGS. 4A and 4B show TEM images of a Ge NW base embedded in a C shell before and after exposure to air, respectively.
Figure 4B:
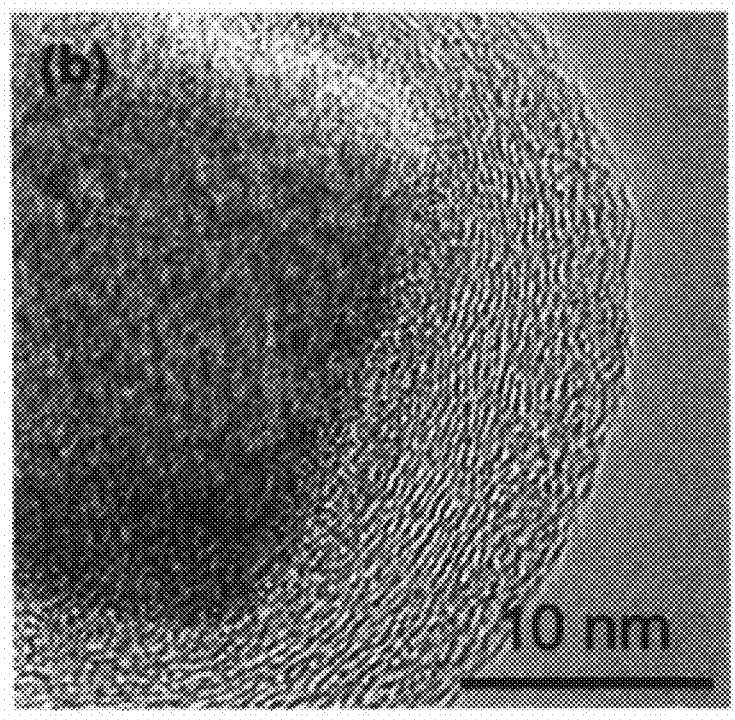

This controlled, metal-induced encapsulation of Ge nanomaterials allows assembly of a protective, passivating, C shell which may prevent oxidation of the wires in ambient environments. FIGS. 4A and 4B show TEM images of a Ge NW base encapsulated by a C shell before and after exposure to air, respectively. Comparison of the two micrographs shows that no oxide is formed on the encapsulated nanomaterials during, and that the C shell itself is not degraded by, a 48-hour exposure to air.

Thus the inventive technology of seeding growth of a graphitic carbon encapsulant on a semiconducting nanomaterial using metal decoration of its surface offers a rational, controllable method of rendering oxidation-resistant nanomaterials not generally protected by native oxides. In some cases this results in an encapsulated semiconducting nanomaterial comprising a semiconducting nanomaterial having a diameter and a surface, the diameter of the semiconducting nanomaterial having a magnitude between about 1 nm and about 100 nm; an encapsulant, the encapsulant enclosing the semiconducting nanomaterial and comprising an ordered carbon shell; and an interface between the ordered carbon shell and the semiconducting nanomaterial, the interface decorated with islands of metal, as seen in FIGS. 4A and 4B.

Figure 5A:
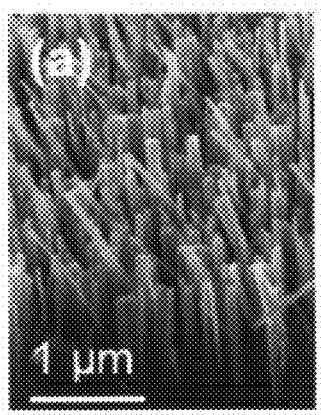
FIGS. 5A through 5E show overview and detailed images of catalyst-free GaN NWs on a Si(111) substrate.
Figure 5C:
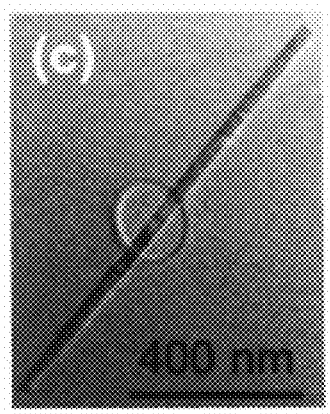
Figure 5B:
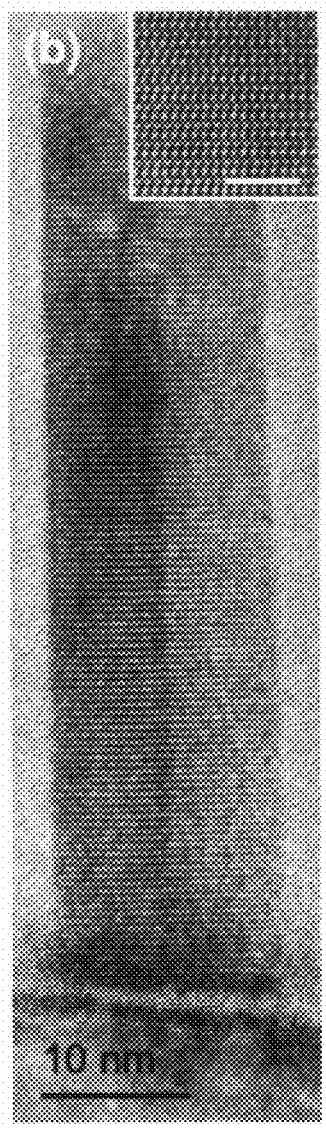
Figure 5D:
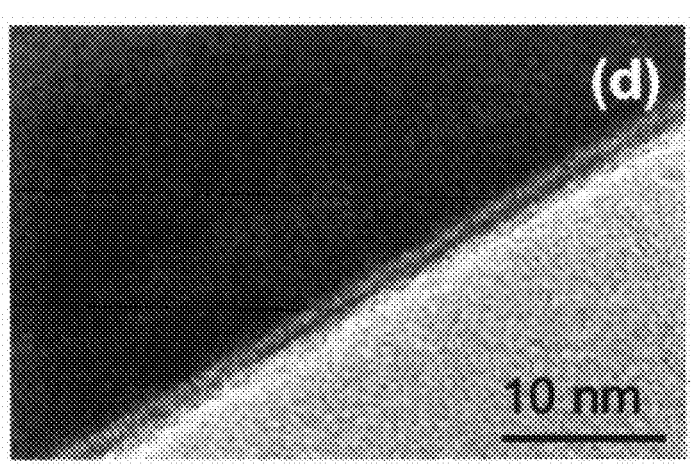
Figure 5E:
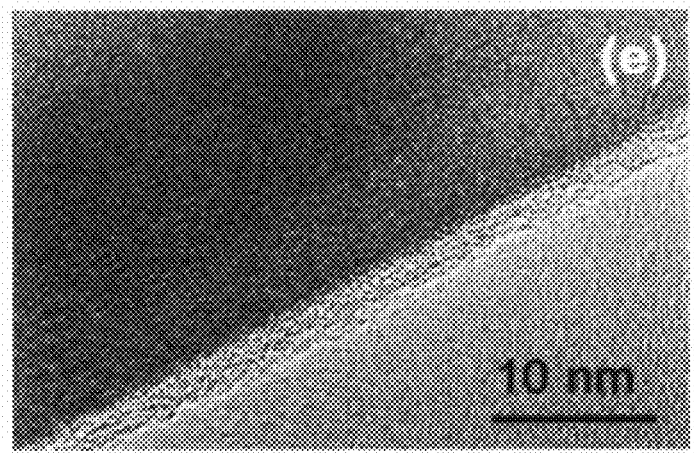

As another example, GaN nanowires have been grown on Si(111) substrates without catalysts at 790° C. in an ultra-high-vacuum (UHV) chamber with a base pressure of 2×$10^{-10}$ torr. FIGS. 5A and 5C show overviews, while FIGS. 5B, 5D, and 5E show detailed high-resolution TEM images, of such catalyst-free GaN NWs on a Si(111) substrate. Typical wires grown under such conditions (FIG. 5A) are straight, about 1 µm in length and about 10-50 nm in diameter. FIG. 5B shows a detailed image of one nanowire. The inset, with a scale bar of 1 nm, shows the wurtzite crystal structure of the same wire. The TEM samples were placed on amorphous carbon supports, which also served as a source of C.

The wire in FIG. 5C is approximately 1.1 µm long with a diameter of about 35 nm. FIG. 5D shows the detailed structure of the NW close to its surface. FIG. 5E shows the same section of the NW after in situ annealing at temperatures rising slowly from room temperature to about 500° C. The annealing conditions were similar to those described previously with respect to Ge NWs. Note that only an amorphous C film is generated on the surface of the NW by the annealing process.

Figure 6A:
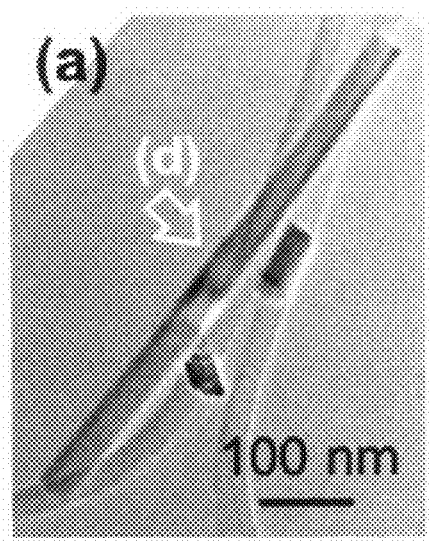
FIGS. 6A through 6F compare low- and high-resolution TEM images showing a typical In-terminated GaN NW completely embedded in a C shell.
Figure 6D:
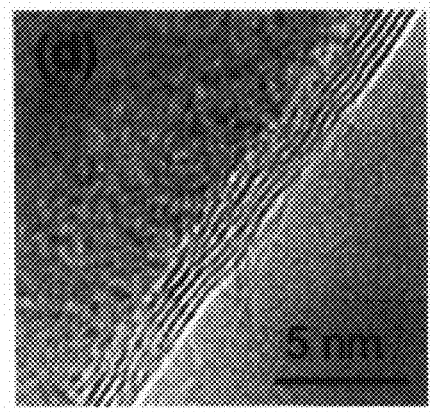
Figure 6B:
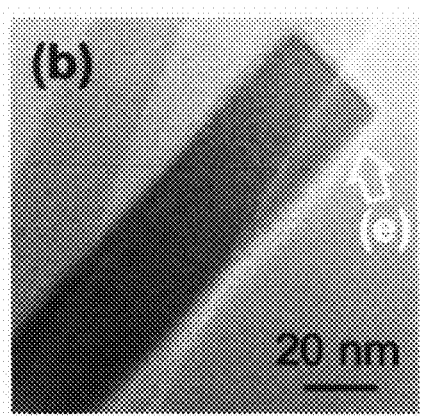
Figure 6E:
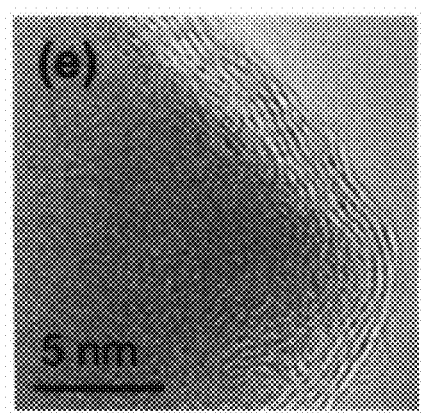
Figure 6C:
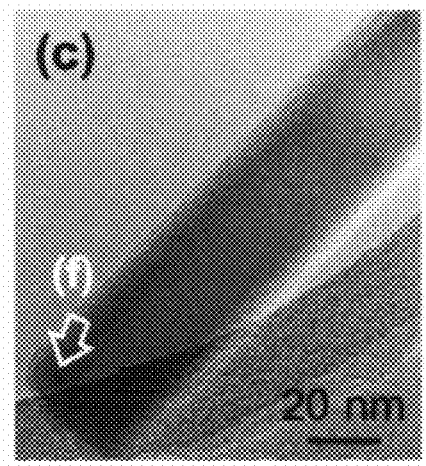
Figure 6F:
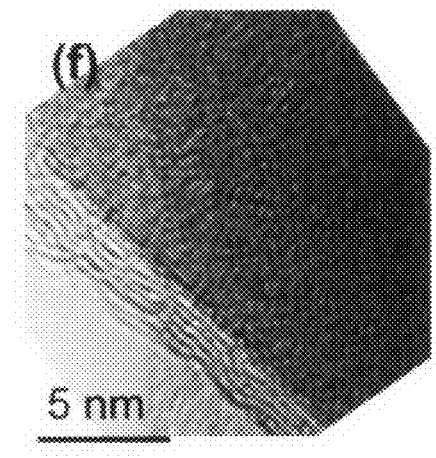

To decorate the surface of these metal-free semiconducting nanowires, such as the GaN NWs, with islands of metal, about 15 nm of InGaN may be deposited at a nominal In:Ga ratio of 2.1:3 under the same conditions as for the GaN growth. FIGS. 6A through 6F contain TEM images showing a typical In-terminated GaN NW completely embedded in a C shell. FIG. 6D is a high-resolution micrograph of the area of the nanowire of FIG. 6A noted by the arrow (d). Similarly FIGS. 6E and 6F are high-resolution micrographs of the corresponding areas pointed out with arrows in FIGS. 6B and 6C, respectively. In FIGS. 6B and 6C the C shell on the GaN core is clearly visible; taken near opposite ends of the NW the micrographs show that the ordered graphene shell continuously covers the entire NW surface. The higher-resolution micrographs of FIGS. 6D through 6F show the ordered nature and uniform thickness of the C shell surrounding the semiconducting GaN core. The shell has about five graphene layers with a spacing of 0.35-0.36 nm, in agreement with the c-axis spacing of graphene sheets in graphite.

Unlike the uniform TEM contrast throughout of FIGS. 5D (before annealing) and 5E (after annealing), dark spots are visible in the micrographs of the In-terminated GaN in FIGS. 6D through 6F. These spots may be attributed to In clusters randomly dispersed on the GaN surface. The clusters are observed to be about 1 nm in diameter and without discernable crystalline structure. A close look at the NW/C-shell interface reveals that the first layers of the shell consist of small curved graphene fragments that envelop In clusters. As the graphene fragments are coated by progressively larger sheets they become less curved until they develop into extended, continuous graphene layers at the surface of the shell. FIGS. 7A and 7B contain TEM images of the core/shell interface of an In-decorated GaN NW embedded in at shell. Arrows indicate In clusters enveloped by curved graphene fragments.

FIG. 7C shows a schematic representation of the initial stages of the assembly of a C shell. FIG. 7C depicts an envelope of curved graphene flakes surrounding In clusters (i) that then serves as a template for extended graphene layers (ii). In general, the semiconducting core may be decorated with metallic nanoclusters by several methods. One such is direct deposition of the metal onto the surface of the semiconducting nanomaterial. In some cases metallic clusters form by segregation of metals from the interior of the nanomaterial or from a catalyst particle to the surface. For semiconducting nanomaterials incorporating a metallic component, the metal clusters may be generated by partial decomposition of the semiconducting nanomaterial. An example of the latter may be incorporating a metal into an outermost layer of a nascent semiconducting nanomaterial during growth, and allowing its subsequent partial decomposition into metal-rich areas (metallic clusters) and metal-poor areas (metal-free surfaces).

Semiconductors need not be limited to uniform materials. Semiconducting superlattices are typically alternating nanoscale layers of at least two different materials that exhibit properties distinct from those of any of the constituent materials. Semiconducting nanomaterials, elemental, compound, or superlattices, have unique electrical, optical, and magnetic properties due to their physical properties (size, surface area, etc.) and chemical properties (e.g. surface bond configuration). It is these intrinsic properties that devices made from these materials seek to exploit. The passivating carbon shell as described herein may satisfy surface bonding configurations to reduce surface and interface states and allow the intrinsic properties to remain virtually unchanged. In other words, given the same stimulus, for example impinging electromagnetic radiation or an electrical potential, the encapsulated semiconducting materials give the same or virtually the same response, generation of charge carriers or an induced electrical current, as those of a pristine semiconducting nanomaterial absent surface states. The absence of surface or interface states may allow prediction of the response of the nanomaterial to a given stimulus, as opposed to the unpredictability of properties of unpassivated semiconducting nanomaterials.

Devices exploiting these properties may include, for example, sensors. The sensors work by detecting a change in response to a given stimulus. For example, the passivated core/shell structure may be irradiated by light (electromagnetic radiation) and an induced current or emission of light of a certain wavelength may be measured. The response to the stimulus, e.g. a change in the brightness or wavelength of the emitted light, may be different if the species, such as contaminant atoms or molecules, are attached to the C shell. The stimulus may be an applied voltage, an applied current, irradiation by electromagnetic radiation of at least one wavelength, or any useful stimulus such as a mechanical stress or exposure to particular chemical species, for example. The response to be detected may be an induced current or voltage, a mechanical strain, a change in the electronic structure of the nanomaterial, or absorption, reflection, or emission of electromagnetic radiation, i.e. light of at least one wavelength, and the like.

Species such as atoms, molecules, viruses, cells, bacteria, prokaryotes, and eukaryotes may be detected by such a sensor. Properties of these species, such as their presence or absence, their quantity (concentration or absolute magnitude), size, or identity, in addition to other properties such as oxidation state for example, may be determined by noting the modifications to the expected response. Other sensors may use an applied electrical potential to induce an electrical current, a current to induce a voltage, or a current to stimulate emission of light, for example.

In certain cases the atomically sharp interface between the shell and the core may create an electronically active junction. Such a junction may have properties such as those exhibited by semiconductor-semiconductor, semiconductor-metal, or semiconductor-dielectric junctions. These properties may be exploited on the nanoscale for application in electronic devices and sensors.

While the foregoing description has been made with reference to individual embodiments of the invention, it should be understood that those skilled in the art, making use of the teaching herein, may propose various changes and modifications without departing from the invention in its broader aspects.

The foregoing description being illustrative, the invention is limited only by the claims appended hereto.

The invention claimed is:

1. A method of controllably encapsulating a semiconducting nanomaterial, the method comprising:
    decorating a surface of the semiconducting nanomaterial with islands of metal;
    exposing the semiconducting nanomaterial decorated with islands of metal to a source of carbon;
    annealing the semiconducting nanomaterial at a temperature between about 25° C. and about 500° C., thereby encapsulating the decorated semiconducting nanomaterial with a carbon encapsulant.

2. The method of claim 1, wherein:
    decorating the surface of the semiconducting nanomaterial comprises allowing segregation to the surface of the semiconducting nanomaterial of a metallic catalyst employable to catalyze formation of the semiconducting nanomaterial.

3. The method of claim 1, wherein:
    decorating the surface of the semiconducting nanomaterial comprises partially decomposing the semiconducting nanomaterial.

4. The method of claim 1, wherein:
    decorating the surface of the semiconducting nanomaterial comprises directly depositing the metal onto the surface of the semiconducting nanomaterial.

5. The method of claim 1, wherein:
    exposing the semiconducting nanomaterial to a source of carbon comprises positioning the semiconducting nanomaterial in an atmosphere containing a carbon-carrying precursor gas.

6. A method of controllably encapsulating a semiconducting nanomaterial, the method comprising:
    decorating a surface of the semiconducting nanomaterial with islands of metal;
    exposing the semiconducting nanomaterial to a source of carbon; and
    annealing the semiconducting nanomaterial at a temperature between about 25° C. and about 500° C.; and
    irradiating the semiconducting nanomaterial using an electron beam, the electron beam having an electron energy between about 100 eV and about 1 MeV.

7. A method of controllably encapsulating a semiconducting nanomaterial, the method comprising:
    decorating a surface of the semiconducting nanomaterial with islands of metal;
    exposing the semiconducting nanomaterial to a source of carbon; and
    annealing the semiconducting nanomaterial at a temperature between about 25° C. and about 500° C.,
    wherein exposing the semiconducting nanomaterial to a source of carbon comprises positioning the semiconducting nanomaterial atop a carbon-containing substrate.

8. The method of claim 7, wherein:
    annealing the semiconductor nanomaterial comprises:
    heating the semiconducting nanomaterial to approximately 180° C.;
    holding the temperature at approximately 180° C. for approximately 5 minutes under electron beam irradiation; and
    heating the semiconducting nanomaterial to between approximately 180° C. and approximately 500° C.

9. The method of claim 7, further comprising:
    heating to a temperature sufficient to remove contaminating species, the contaminating species including at least one selected from the group consisting of an oxide of one or more elements comprising the semiconductor and adsorbed contaminants.

10. A method of using an encapsulated semiconducting nanomaterial, the method comprising:
    applying a stimulus to the encapsulated semiconducting nanomaterial, the encapsulated semiconducting nanomaterial comprising a semiconducting nanomaterial having a diameter and a surface, the diameter of the semiconducting nanomaterial having a magnitude between about 1 nm and about 100 nm; an encapsulant, the encapsulant enclosing the semiconducting nanomaterial and comprising an ordered carbon shell; and an interface between the ordered carbon shell and the semiconducting nonmaterial, the interface decorated with islands of metal; and
    detecting a response of the encapsulated semiconducting nanomaterial induced by the stimulus.

11. The method of claim 10, wherein:
    detecting the response comprises detecting properties of species attached to the ordered carbon shell, the properties comprising at least one selected from the group consisting of presence, identity, quantity, and size.

12. The method of claim 11, wherein:
the species comprises at least one selected from the group consisting of an atom, a molecule, a virus, a cell, a bacterium, a prokaryote, and a eukaryote.
13. The method of claim 10, wherein:
the stimulus is selected from the group consisting of an applied voltage, an applied current, and irradiation by electromagnetic radiation of at least one wavelength.

14. The method of claim 10, wherein:
the response is selected from the group consisting of an induced current, an induced voltage, absorption of electromagnetic radiation, reflection of electromagnetic radiation, and emission of electromagnetic radiation.

* * * * *